United States Patent
Venugopal et al.

(10) Patent No.: US 11,357,127 B2
(45) Date of Patent: Jun. 7, 2022

(54) PLENUM FOR GENERATOR SET AND SYSTEMS AND METHODS THEREOF

(71) Applicant: Caterpillar Inc., Peoria, IL (US)

(72) Inventors: Praveen Venugopal, Bangalore (IN); Timothy D. Collins, Fayetteville, GA (US); Andrew Philip McKeown, Peoria, IL (US); Nicholas Murray, Larne (GB); Joseph W. Brunton, Lafayette, IN (US); Karl A. Hagen, Peoria, IL (US); Damian Grant, Crumlin (GB)

(73) Assignee: Caterpillar Inc., Peoria, IL (US)

( * ) Notice: Subject to any disclaimer, the term of this patent is extended or adjusted under 35 U.S.C. 154(b) by 27 days.

(21) Appl. No.: 16/931,258

(22) Filed: Jul. 16, 2020

(65) Prior Publication Data

US 2022/0022341 A1 Jan. 20, 2022

(51) Int. Cl.
*H05K 7/20* (2006.01)
*F24F 7/00* (2021.01)

(52) U.S. Cl.
CPC ........... *H05K 7/20145* (2013.01); *F24F 7/00* (2013.01); *H05K 7/20718* (2013.01)

(58) Field of Classification Search
CPC .... H05K 7/20145; H05K 7/20718; F24F 7/00
See application file for complete search history.

(56) References Cited

U.S. PATENT DOCUMENTS

| 2,665,840 | A | * | 1/1954 | Powell | A01N 25/08 |
| | | | | | 415/116 |
| 6,614,524 | B1 | | 9/2003 | Kuwabara | |
| 7,193,333 | B1 | | 3/2007 | Kitch | |
| 7,903,407 | B2 | | 3/2011 | Matsushima et al. | |
| 8,405,984 | B2 | | 3/2013 | Donowho et al. | |
| 10,624,232 | B2 | | 4/2020 | Krietzman | |
| 2008/0055846 | A1 | | 3/2008 | Clidaras | |
| 2012/0171943 | A1 | * | 7/2012 | Dunnavant | F28D 15/02 |
| | | | | | 454/184 |
| 2015/0034270 | A1 | * | 2/2015 | Kim | F28D 15/0266 |
| | | | | | 165/11.1 |
| 2016/0146867 | A1 | | 5/2016 | Schuh | |
| 2017/0034948 | A1 | | 2/2017 | Hwang | |
| 2018/0168071 | A1 | * | 6/2018 | Edge | H05K 7/20145 |
| 2018/0354712 | A1 | | 12/2018 | Goleczka | |

FOREIGN PATENT DOCUMENTS

CN 206972316 U 2/2018

* cited by examiner

*Primary Examiner* — Abhishek M Rathod
(74) *Attorney, Agent, or Firm* — Xsensus LLC

(57) ABSTRACT

A plenum for processing one or more byproducts output from a generator, and systems and methods thereof, can have the plenum in the form of a hollow elongate rectangular box having a first end and a second end opposite the first end. The plenum can have a frame and a sidewall fixed to the frame, and can be adapted to be oriented vertically when operatively coupled to receive the one or more byproducts from the generator. The sidewall can include an opening adapted to receive heated air from the generator as one of the byproducts from the generator.

25 Claims, 14 Drawing Sheets

US 11,357,127 B2

PLENUM FOR GENERATOR SET AND SYSTEMS AND METHODS THEREOF

TECHNICAL FIELD

The present disclosure relates to plenums, and more particularly to plenums and systems and methods involving plenums adapted to process and output one or more byproducts from a generator of a generator set.

BACKGROUND

Applications such as data centers can require multiple generator set packages as backup power supplies to keep their servers running continuously. Running generator set packages can emit exhaust gases and discharge heat from radiators or other coolers. However, exhaust gases and heat discharge can adversely impact the area into which each is released. In the context of data centers, exhaust gas may make the surrounding environment unfit for data center operators or surrounding inhabitants, and heat discharge at the same level as the data center can lead to degraded server performance.

U.S. Pat. No. 10,624,232 ("the '232 patent") describes an enclosure and an exhaust air duct that is adapted to segregate hot air being exhausted from the compartment from cool air entering the compartment. The exhaust air duct extends upward from the enclosure, and is rectangular in cross-section. According to the '232 patent, the height of the exhaust air duct is adjustable.

There is a need to provide a means by which to process byproduct caused by operation of each generator of a generator set package, such as exhaust gas and/or heated air, such that the byproduct is released into the atmosphere at an acceptable height, which may be set according to local, regional, or national regulatory requirements.

SUMMARY OF THE DISCLOSURE

In one aspect, the present disclosure provides or implements a plenum in the form of a hollow elongate rectangular box having a first end and a second end opposite the first end for processing one or more byproduct outputs from a generator of a generator set of one or more generators. The plenum can comprise a frame, all corners of the frame having lifting castings; and a corrugated sidewall fixed to the frame. The frame can have respective sets of vertical and horizontal support beams at the first end of the plenum and the second end of the plenum, and a set of vertical and horizontal support beams at a plurality of locations spaced apart from each other in a length direction of the plenum, between the first end and the second end of the plenum. The plenum can be adapted to be oriented vertically when operatively coupled to receive the one or more byproduct outputs from the generator. The corrugated sidewall can include a first opening adapted to receive heated air from the generator as one of the one or more byproduct outputs from the generator.

In another aspect, the present disclosure can provide or implement a method regarding a modular system for processing byproducts of a generator. The method can comprise providing a first vertical plenum in the form of a first hollow elongate rectangular box having a first end and a second end opposite the first end, the first end being adapted to be fixedly coupled to a mounting surface and the second end being open; and providing an exhaust conduit that extends vertically inside the first vertical plenum toward the second end of the first vertical plenum. The first vertical plenum can be adapted to be open to atmosphere. The first vertical plenum can have a first opening in a sidewall and is adapted to receive heated air associated with operation of the generator via the first opening and pass the heated air to the second end of the first vertical plenum. The first vertical plenum can have a second opening in the sidewall and can receive an inlet of the exhaust conduit such that the exhaust conduit is adapted to receive exhaust gas from the generator. Each of the second end of the first vertical plenum and an outlet of the exhaust conduit can be at a predetermined height above the first and second openings.

In yet another aspect a modular system for venting one or more generators of a generator set of a data center can be provided or implemented. The system can comprise a mounting base adapted to be mounted on a mounting surface; a first vertical plenum in the form of a first hollow elongate rectangular box having a first end and a second end opposite the first end, the first end being fixedly coupled to the mounting base and the second end being open; and an exhaust conduit that extends vertically inside the first vertical plenum toward the second end of the first vertical plenum. The first vertical plenum can be adapted to be open to atmosphere. The first vertical plenum can have a first opening in a sidewall on a first side of the first vertical plenum and can be adapted to receive heated air associated with operation of one of the one or more generators via the first opening and pass the heated air to the second end of the first vertical plenum. The first vertical plenum can have a second opening in the sidewall on the first side of the first vertical plenum and can receive an inlet of the exhaust conduit such that the exhaust conduit is adapted to receive exhaust gas from said one of the one or more generators. The second end of the first vertical plenum can extend to a predetermined height such that the heated air and the exhaust gas are output from the first vertical plenum at a level of atmosphere higher than a predetermined level of atmosphere of the data center.

Other features and aspects of this disclosure will be apparent from the following description and the accompanying drawings.

DETAILED DESCRIPTION

The present disclosure relates to plenums, and more particularly to plenums and systems and methods involving plenums adapted to process and output one or more byproducts from a generator of a generator set.

Figure 1:
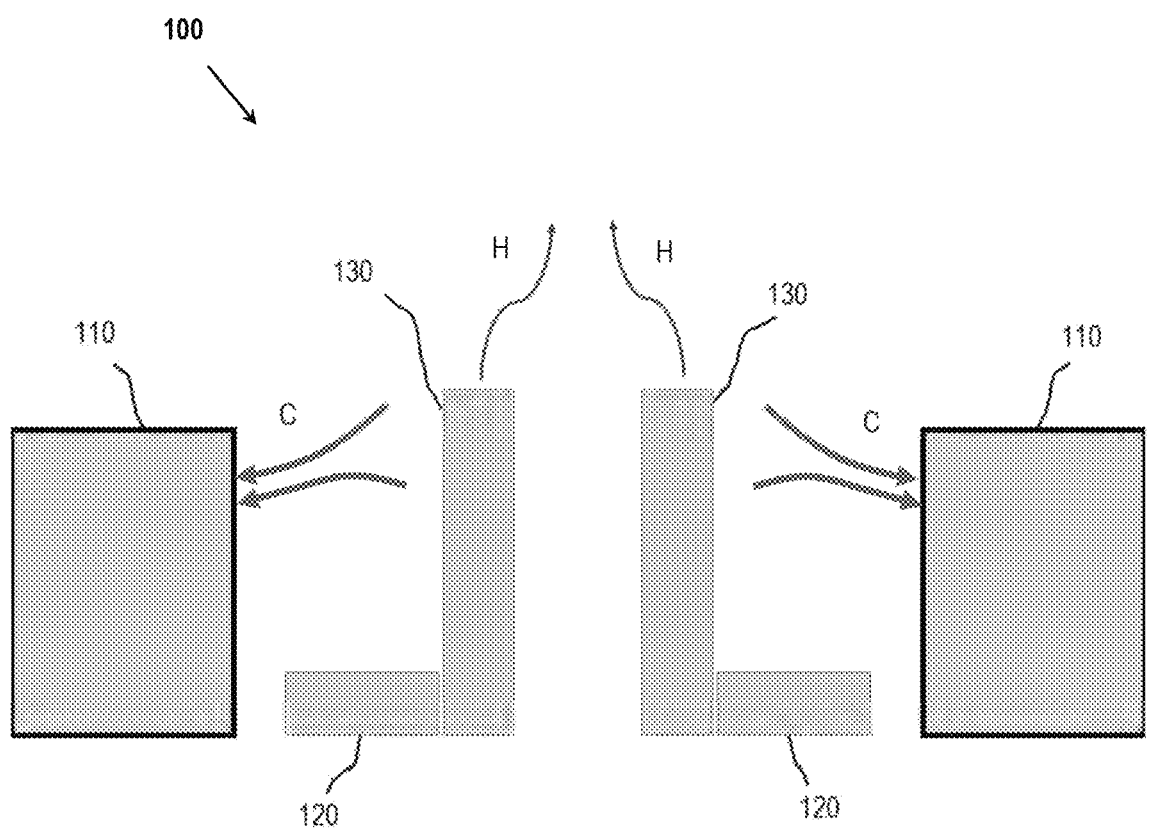
FIG. 1 is a block diagram of a system according to embodiments of the disclosed subject matter.

FIG. 1 is a block diagram of a system 100 according to embodiments of the disclosed subject matter. Generally, system 100 may be referred to as a data center that houses a plurality of servers (not expressly shown) in buildings 110. The system 100 may include one or more generator sets (gensets) 120 each having one or more generators to provide electrical power for the servers in the event of aid electrical power failure. Each generator set 120 can have an associated mechanical duct or plenum 130, which may be exposed to the open atmosphere. Generally, the plenum 130 can receive heated air from the generator set as a result of operation of a generator of the generator set and dissipate the heat to the atmosphere in a controlled manner. Optionally, according to one or more embodiments, exhaust gas from the generator may also be output from the plenum 130. The plenum 130, according to one or more embodiments, can output the heated air and optionally exhaust gas vertically such that the heated air and optionally exhaust gas exit the plenum primarily in a vertical direction.

Thus, the plenum 130 can output heated air and optionally exhaust gas from a corresponding generator to the atmosphere at an acceptable height. As shown in FIG. 1, the heated air H can be outputted to the atmosphere at a height above the data center buildings 110. Thus, as diagrammatically shown in FIG. 1, this provision may allow for cooling air C for the data center buildings 110 to be unaffected by the heated air H exhausted from the generator set. Additionally or alternatively, acceptable height, as used herein, can mean a height set by local, region, or national regulatory requirements, Generally, at least in the case of outputting exhaust gas from the generator, such acceptable height can be above at least a so-called next level of atmosphere or living atmosphere at a ground level, for instance. According to one or more embodiments, acceptable height may mean a height above a multi-story structure, such as a multi-story data center.

Figure 2:
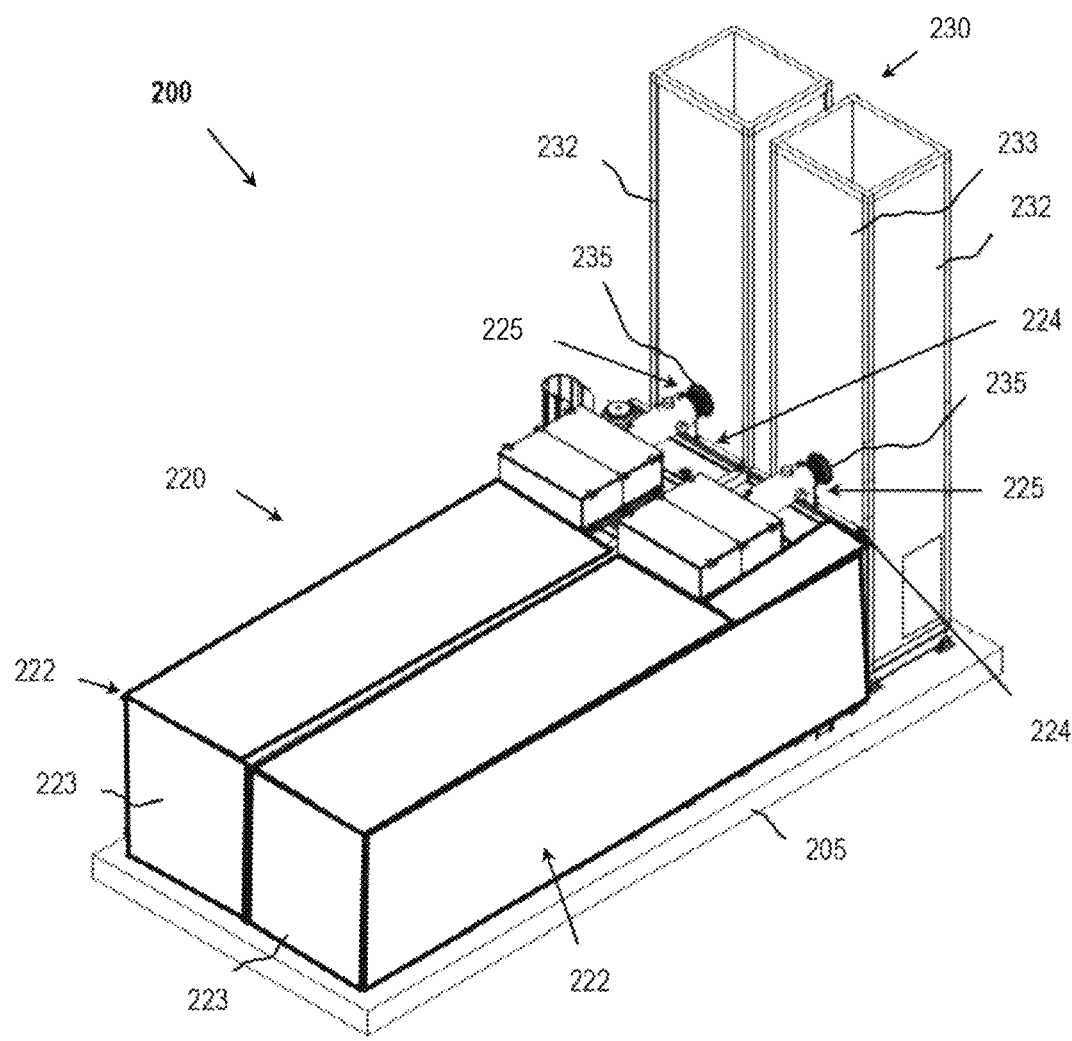
FIG. 2 shows an overhead perspective view of a system according to embodiments of the disclosed subject matter.

Turning to FIG. 2, FIG. 2 shows an overhead perspective view of a system 200 according to embodiments of the disclosed subject matter. In this case, the system 200 can be comprised of a generator set system 220 and a plenum system 230.

The system 200 shows that the generator set system 220 can have a pair of generator sets 222 in respective housings 223. Likewise, the plenum system 230 can have a pair of plenums 232. Inside each housing 223 can be a generator (not expressly shown) of the generator set 222.

The system 200 may be referred to as a twin pack, where two generator sets 222 are set on a mounting surface 205, along with corresponding separate plenums 232. The mounting surface 205 may be shared by the generator sets 222 and the plenums 232, or, alternatively, the plenums 232 may have their own mounting surface. According to one or more embodiments, the mounting surface 205 may be pavement or concrete, for instance. Though FIG. 2 shows a pair of generator sets 222 and a pair of plenums 232, embodiments of the disclosed subject matter are not so limited. Rather, only one generator set 222 and plenum 232 may be provided, or more than two pairs of generator sets 222 and plenums 232 may be provided, either aligned as shown in FIG. 2, aligned differently, or separately provided.

A heat interface 224, which may include a vent and connecting duct leading from the housing 223, can communicably connect the generator set 222 and the plenum 232. Generally, the heat interface 224 may be a radiator of the generator set 222 that carries heated air inside the housing 223 due to operation of the generator, for instance, under force from a fan inside, the housing 223, to outside the housing 223. In this case, the heated air from the housing 223 can be provided via the heat interface 224 to inside the plenum 232 via an opening 234 (not expressly shown in FIG. 1) in a sidewall 233 of the plenum 232. The opening 234 in plenum 232 that corresponds to the heat interface 224 to receive heated air may be referred to herein as a first opening. The heated air may subsequently be routed by the plenum 232 to a far end thereof, which may be referred to herein as a second end of the plenum 232 and may be open.

A gas exhaust interface 225, which can include a conduit (e.g., a flexible conduit) and a muffler or silencer, can be provided between an exhaust gas output of the generator in the housing 223 and the plenum 232. The gas exhaust interface 225 can communicably connect, for instance, the flexible conduit thereof, to an opening 235 in the sidewall 233 of the plenum 232. Exhaust from the engine of the generator can be output to the plenum 232 via the gas exhaust interface 225. Discussed in more detail below, the opening 235 may lead to an exhaust conduit that runs or extends inside the plenum 232. The opening 235 in plenum 232 that corresponds to the gas exhaust interface 225 may be referred to herein as a second opening. The exhaust gas may subsequently be routed by the exhaust conduit in the plenum 232 toward the far end of the plenum 232, which, as noted above, may be referred to as a second end of the plenum 232. The outlet of the exhaust conduit may be at or at the second end, of the plenum 232. Thus, the exhaust gas may be output to the atmosphere without or without sufficient contact with the inner side surfaces of the plenum 232. Though FIG. 2 shows the second opening 235 being in the same sidewall 233, the second opening 235 may instead be in a sidewall different from the sidewall 233 of the first opening 234. The outer surface of the exhaust conduit may be coated with temperature resistant coating, such as temperature-resistant black paint.

Though the plenum 232 interfaces with the heat interface 224 and the gas exhaust interface 225, these interfaces may not provide structural support for the plenum 232. That is, the plenum 232 may be considered freestanding, and may be able to withstand certain wind load and seismic activity without the need for additional support, such as guide wires.

Figure 3:
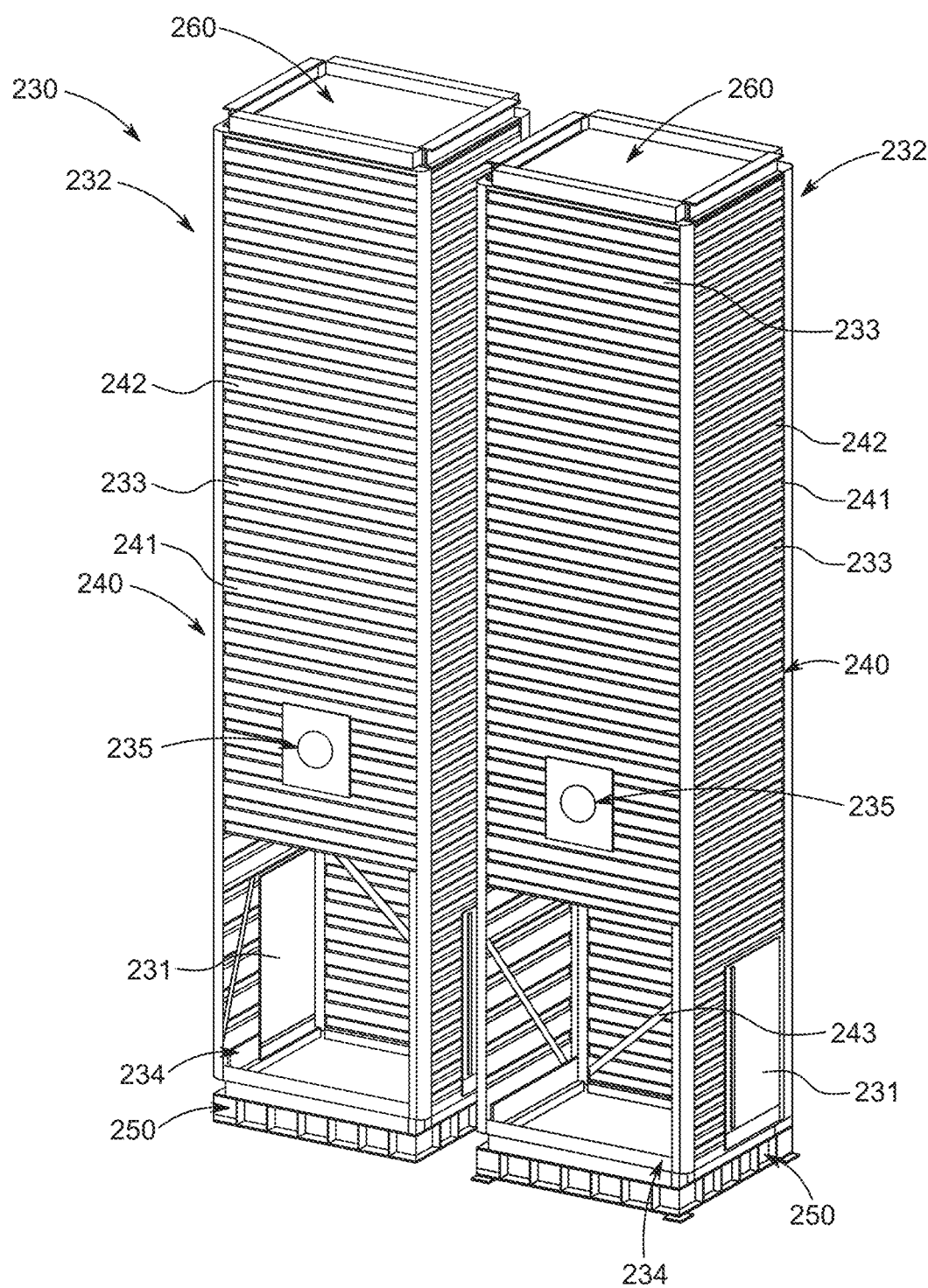
FIG. 3 is a perspective view of a pair of plenums, for the system of FIG. 2, according to embodiments of the disclosed subject matter.

FIG. 3 is a perspective view of the plenum system 230. Notably, FIG. 3 shows the first opening 234 below the second opening 235, as an example. Additionally, an opening sectional area of the first opening 234 may be greater than the second opening 235. Generally, the cross-sectional area of the first opening 234 can be the same as the cross-sectional area of the output of the heat interface 224. Like the cross-sectional area of the first opening 234, the cross-sectional area of the plenum 232 can be the size as the cross-sectional area of the output of the heat interface 224 or greater. Such sizing can be to accommodate back pressure. That is, the sizing can be such that back pressure is prevented entirely, or such that back pressure to the generator set 222 above a predetermined threshold does not occur (e.g., 6.5 kp·m). According to one or more embodiments, the back pressure accommodating configuration of the plenum 232, which may be referred to as a high cube construction, may be characterized as the plenum 232 being a pressure neutralizing chamber.

Figure 4:
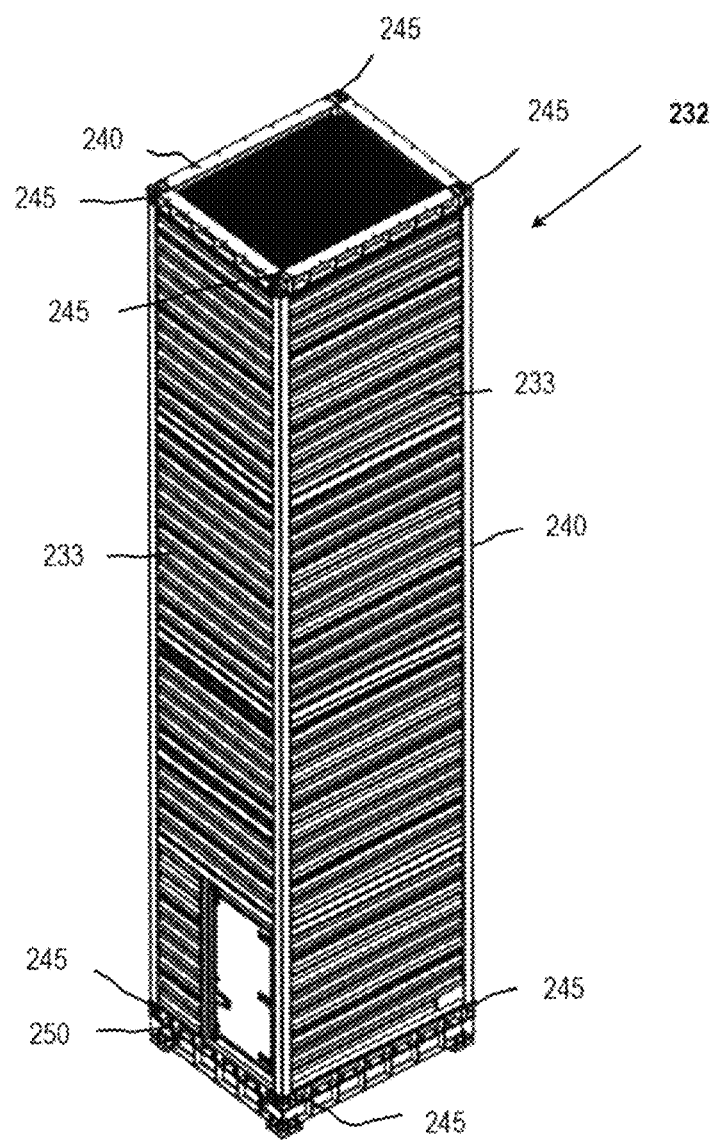
FIG. 4 is a perspective view of a plenum for the system of FIG. 2 according to embodiments of the disclosed subject matter.

FIG. 3 also shows that each of the plenums 232 may have a service door 231 in a sidewall thereof. The service 231 may be a left handed or a right-handed service door, depending upon where the service door 231 is provided on the plenum 232 and where access to the service door 231 is available. As shown in FIG. 3, the size of the service door 231 may accommodate human entry to inside the plenum 232. In this regard, the service door 231 may have as a provision an emergency open feature accessible from inside the plenum 232. An light may be provided inside the plenum 232, for instance, in the form of a reflective or self-illuminating decal. A lock or latch may be provided for the service door 231, whereby when the service door 231 is fully open the service door 231 can be locked in place or latched to the corresponding sidewall of the plenum 232. Optionally, a handle for the service door 231 can be at a suitable height relative to the height of the door above the mounting surface 205 taking into consideration the height of a mounting base 250. For instance, the handle may be provided below a halfway point of the height of the service door 231, such as shown in FIG. 4. For instance, the handle may be positioned 978 mm from the bottom (i.e., first end) of the plenum 232.

FIG. 4 is a different perspective view of the plenum 232. As shown in FIG. 3 and FIG. 4, the plenum 232 can be in the form of a first hollow elongate rectangular box having a first end and a second end opposite the first end. The first end of the plenum 232 can be fixedly coupled to the mounting base 250, which, in turn, can be fixedly mounted to the mounting surface 205. The second end of the plenum 232 may be open entirely or via a grate or screen (discussed in more detail below). Hence, the plenum 232, via at least the open second end thereof, can be open to the atmosphere or environment.

FIG. 4, like FIG. 3, show that the plenum 232 can have a frame 240 and sidewalls 233. The sidewalls 233 may be fixed to the frame 240 (e.g., via welding) and can be corrugated. FIG. 3 and FIG. 4 show that the corrugation can be horizontal to the mounting surface 205, meaning that the peaks and valleys each extend horizontally. Such corrugation of the sidewalls 233 may provide strength against loads, such as wind loads. The frame 240 can be comprised of interconnecting sets of vertical support beams 241 and horizontal support beams 242. The vertical support beams 214 may extend from the first end and second ends of the plenum 232. Likewise, the horizontal support beams 242 may be provided at each of the first and second ends of the plenum 232. As shown in FIG. 3, the horizontal support beams 242 may also be provided at one or more spaced-apart locations between the first and second ends of the plenum 232. The vertical support beams may likewise be provided between the first and second ends of the plenum 232. The frame 240 may be made of corrosion-resistant or anti-corrosion material, such as steel (e.g., stainless steel, weathering steel, etc.). Discussed in more detail, the frame 240 may include or otherwise have fixedly coupled between the horizontal support beams 242 and the vertical support beams 241 a plurality of diagonal support structures 243 (e.g., reinforcing beams), such as shown in FIG. 3. Optionally, the diagonal support structures may be provided only for a certain length or to a certain height of the plenum 232, such as only from the first end to forty feet in length/height, for instance.

According to one or more embodiments, the horizontal support beams 242 may be provided at every ten feet along the length of the plenum 232. Likewise, the vertical support beams 241 may be at or about ten feet in length and can interconnect with the corresponding horizontal support beams 242 provided along the length of the plenum 232. Hence, plenums 232, according embodiments of the disclosed subject matter, may be characterized as modular cubic sections at every ten feet. The horizontal support beams 242 provided between the first and second ends of the plenum 232 may constitute breaks in the sidewalls 233, at least when viewing the plenum 232 from the outside.

FIG. 4 also shows that the frame 240 may have lifting castings 245. The lifting castings 245 may be provided at least at all corners of the plenum 232, and may be used by a transport apparatus, such as at a marine port, can reliably connect to the plenum 232 for transportation of the plenum 232, for instance, to and from a ship. Each of the lifting casting 245 can also include lifting eyes, which can be used for lifting by a crane during installation of the plenum 232, for instance.

The lifting castings 245 may be provided at all corners of the plenum 232, because the dimensions of the plenum 232 may correspond to standardized outer dimensions, such as the outer dimensions of a typical shipping container. On the other hand, in addition to lifting castings 245 being provided at the corners of the plenum 232, additional lifting castings 245 can be provided between the first and second ends of the plenum 232. This may be the case in a case where the plenum 232 is longer than a standard outer dimension available to be accommodated at a particular port (e.g., 30 ft. versus 20 ft.).

Figure 5:
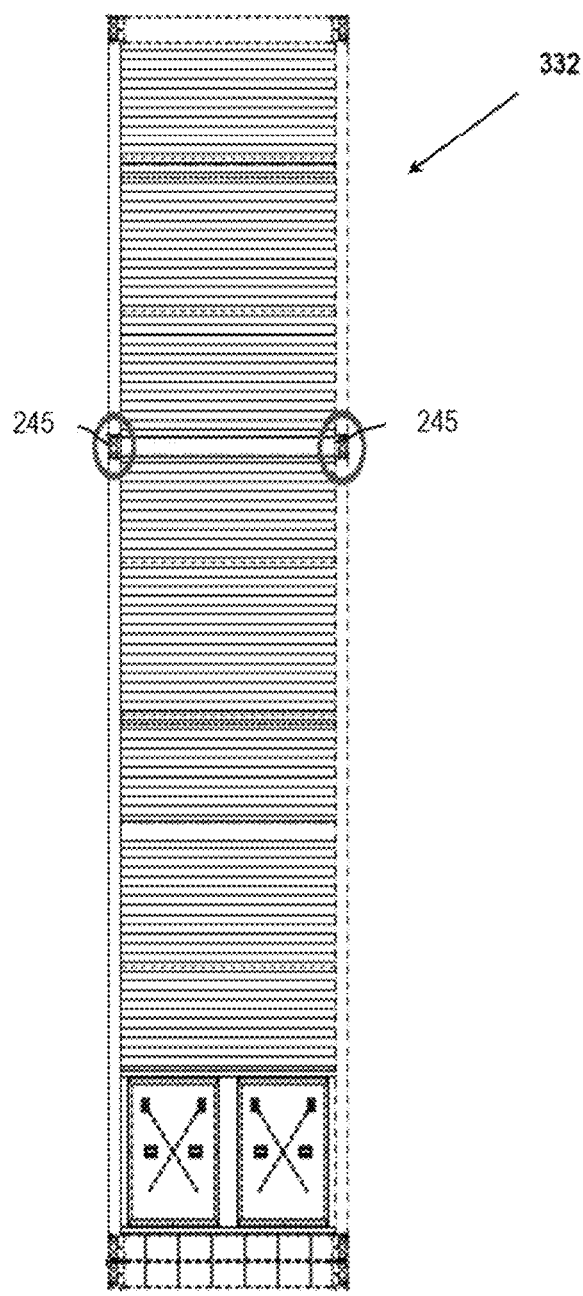
FIG. 5 is a schematic side view of a plenum according to embodiments of the disclosed subject matter.

FIG. 5 is a schematic side view of a 332 plenum that provides lifting castings 245 between the first and second ends of the plenum 332, according to embodiments of the disclosed subject matter. Optionally, since 20 feet may be a standard size for transporting, the additional lifting castings 245 may be provided at twenty feet from the first end of the plenum 332 or twenty feet from the second end of the plenum 332.

Figure 6:
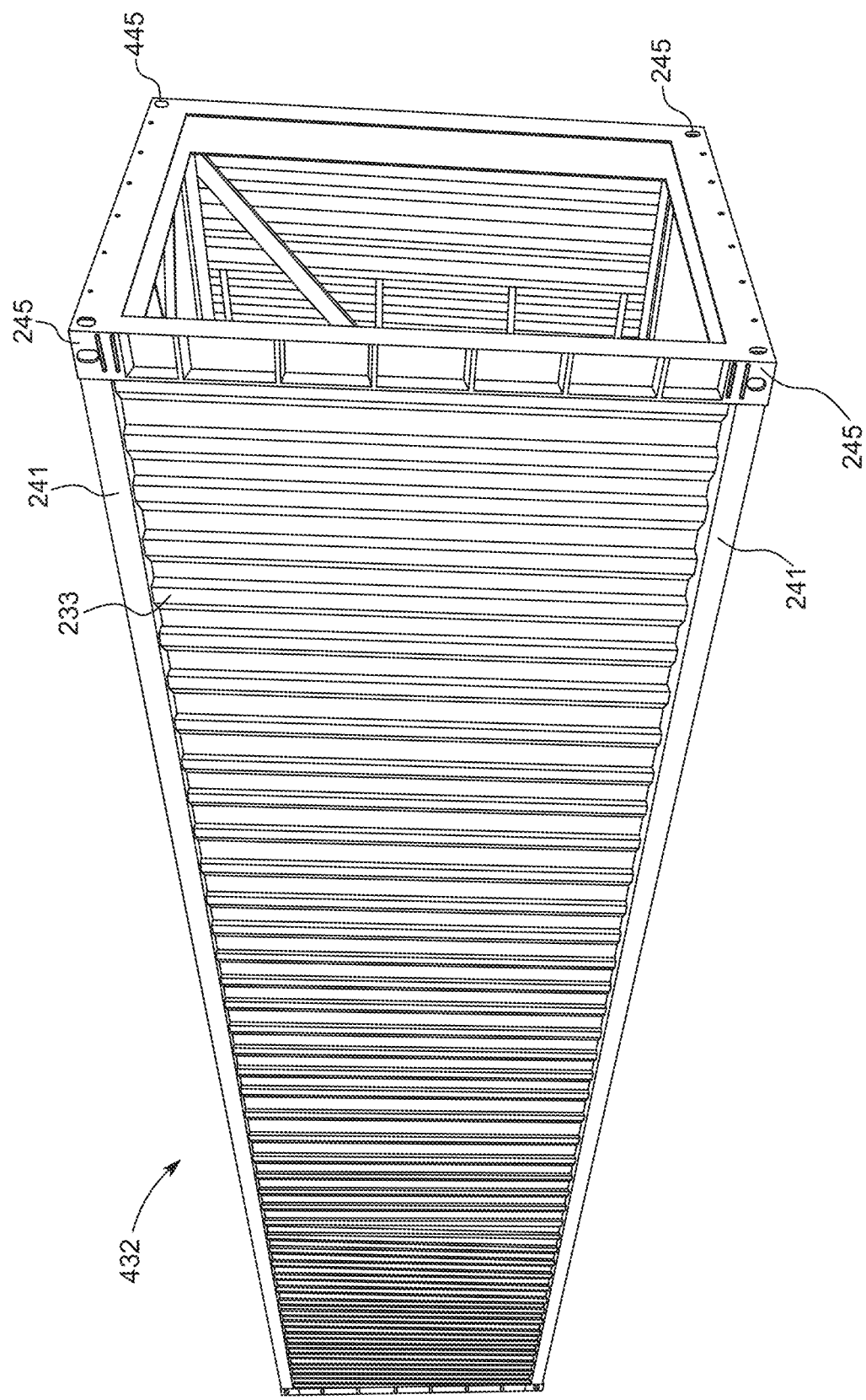
FIG. 6 is an image of a plenum according to embodiments of the disclosed subject matter.

FIG. 6 is an image of a plenum 442 according to embodiments of the disclosed subject matter. The plenum 442 can correspond to either plenum 232 or plenum 332 discussed above. As noted above, plenums according to embodiments of the disclosed subject matter may be based on standard outer dimensions, such as those associated with shipping containers. Thus, embodiments of the disclosed subject matter may have dimensions consistent with standard or high cube ISO 10', 20', 30', or 40' containers, for instance. Discussed in more detail below, plenums according to embodiments of the disclosed subject matter, may be stacked vertically, and may accordingly be characterized as modular. Thus, plenums according to embodiments of the disclosed subject matter may combinations of standard and/or non-standard lengths. On the other hand, embodiments of the disclosed subject matter may not be a mere retrofit of a standard shipping container.

Figure 7:
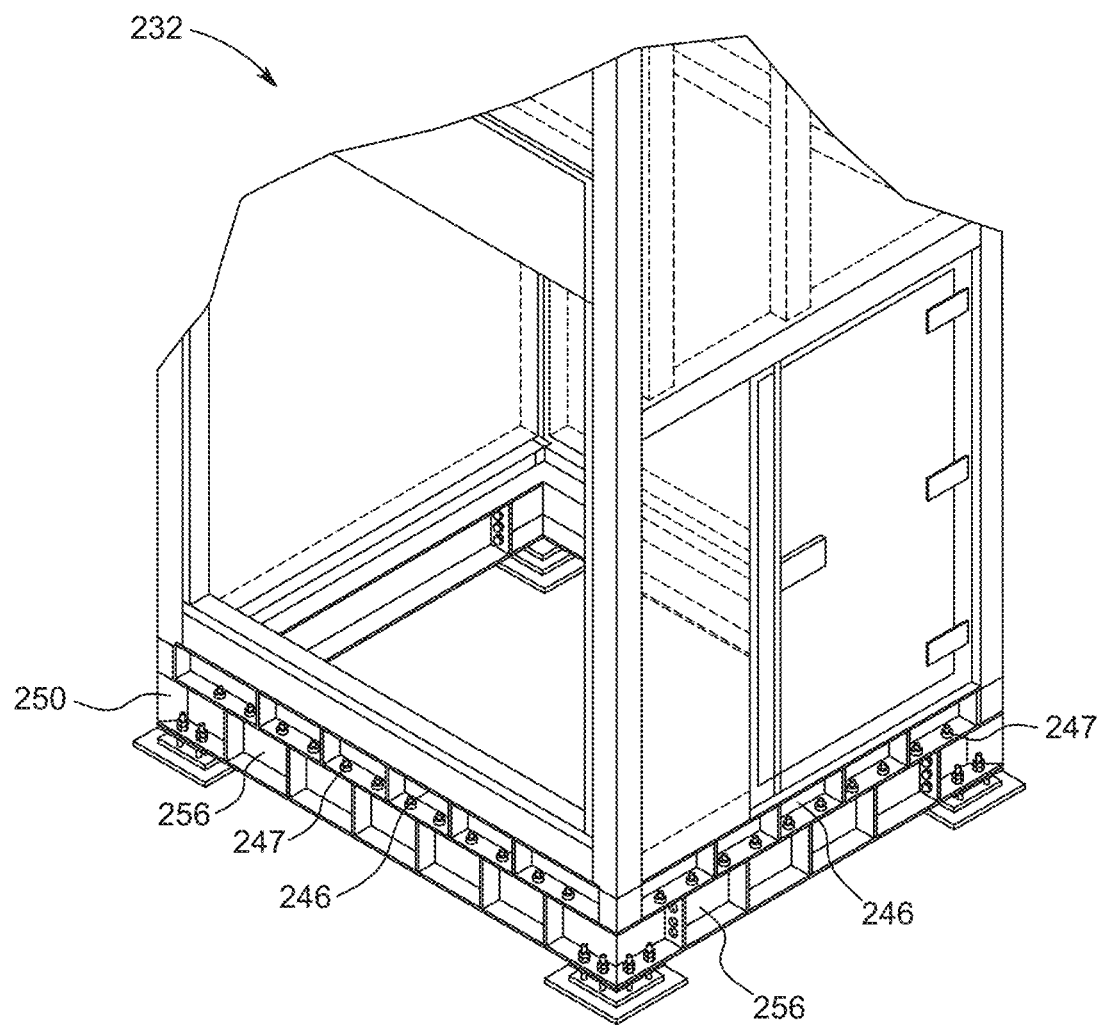
FIG. 7 shows a bottom portion of a plenum according to embodiments of the disclosed subject matter.

FIG. 7 shows a bottom portion of the plenum 232 (or likewise plenums 332, 432). Notably, FIG. 7 shows the connection interface between the plenum 232, particularly the first end thereof, and the mounting base 250. In particular, the plenum 232 can have a plurality of fastening interfaces 246 at the first end thereof and/or at the second end thereof. In that FIG. 7 shows the bottom portion of the plenum 232, only the fastening interfaces 246 at the first end of the plenum 232 are shown.

The fastening interfaces 246, which can extend around the perimeter of the plenum 232, such as shown in FIG. 7, can be fastened to a corresponding fastening interface 256 of the mounting base 250 using fasteners 247. The fasteners 247 may be rivets or bolts as non-limiting examples, and may be made of corrosion-resistance or anti-corrosive material (e.g., SS 10.9 grade, galvanized, etc.). The fastening interfaces 246 of the plenum 232, and likewise the fastening interfaces 256 of the mounting base 250, may be externally accessible, i.e., accessible from outside the plenum 232, and optionally not from inside the plenum 232. Thus, to fixedly couple the plenum 232 to the mounting base 250 it may not be necessary to access the inner volume of the plenum 232. As an example, the fastening interfaces 246 of the plenum 232, and likewise the fastening interfaces 256 of the mounting base 250, may be in the form of H-beams.

Figure 8:
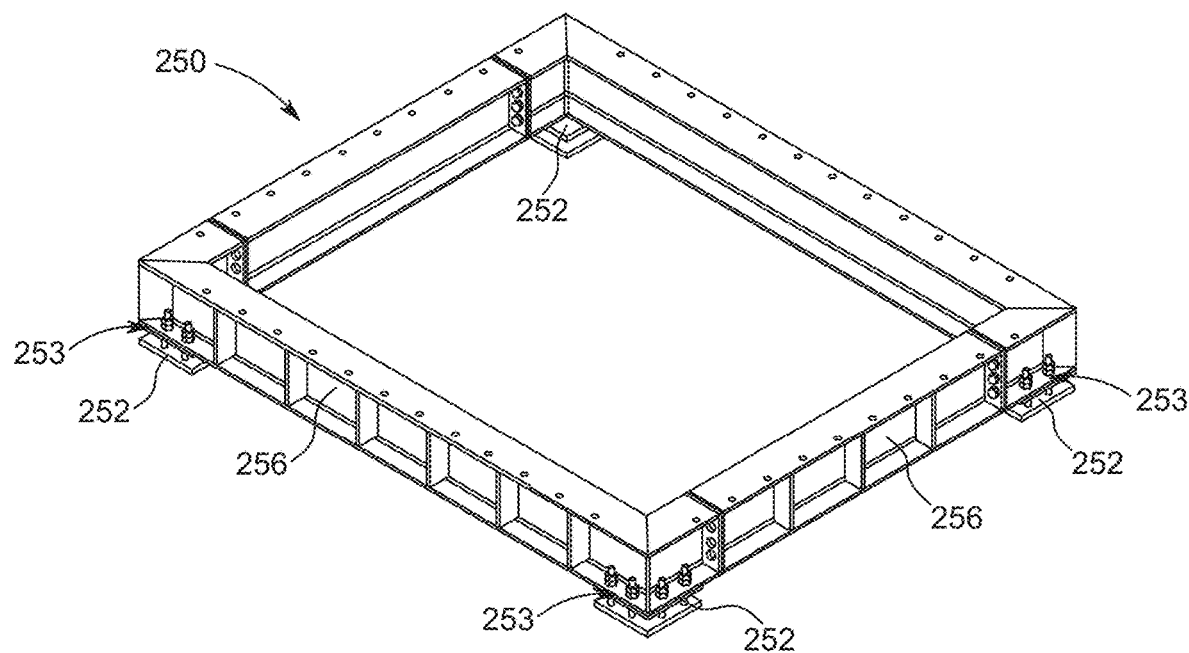
FIG. 8 is a perspective view of a mounting base of or for plenums according to embodiments of the disclosed subject matter.

FIG. 8 is a perspective view of the mounting base 250 of or for plenums according to embodiments of the disclosed subject matter. As noted above, the mounting base 250 may be fixedly coupled to the plenum 232 via fastening interfaces 256 of the mounting base 250. The fastening interfaces 256 may have gussets, such as shown in FIG. 7, which may be provided at regular or even intervals.

The mounting base 250 may also be fixedly coupled to a mounting surface, such as mounting 205 (shown in FIG. 2). In particular, the mounting base 250 can have a plurality of mounting feet 252, for instance, provided at corners of the mounting base 250, such as shown in FIG. 7. Provided with each mounting foot 252 may be a plurality of adjustment screws 253, which may also be referred to as leveling screws 253. The corners of the mounting base 250 may be adjustable in height via operation of the leveling screws 253. Such adjustment may be to level the mounting base 250 and or to adjust position of portions of the plenum 232, such as the first opening 234 and/or the second opening 235.

According to one or more embodiments, the mounting base 250 may be configured as a split or multi-piece component, for instance, which be assembled or disassembled. Thus, the mounting base 250, when disassembled, may be able to be stored inside the plenum 232 during transport or shipping.

Figure 9:
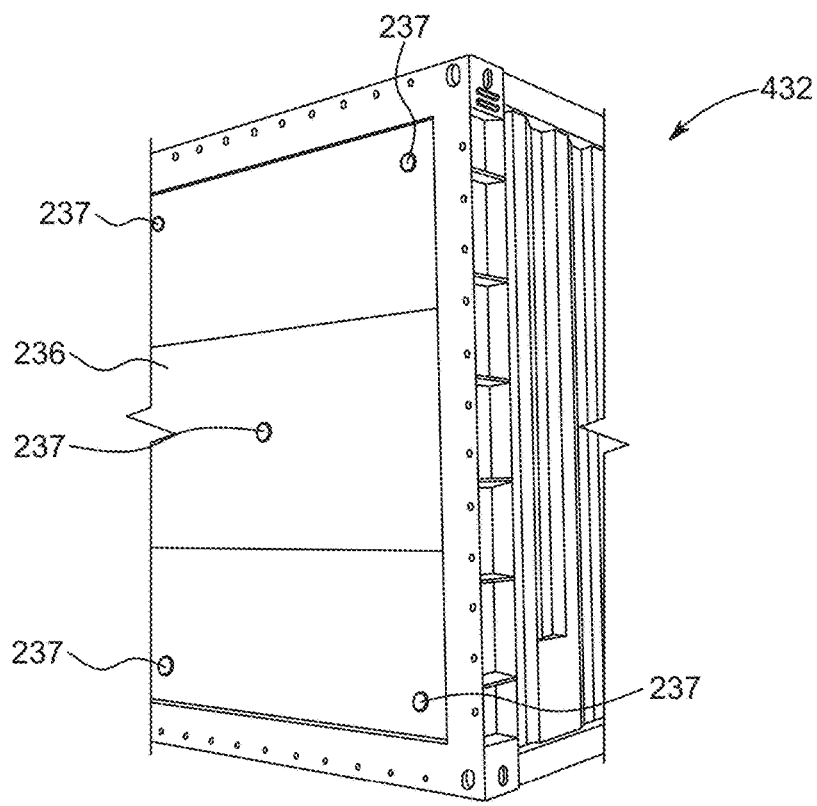
FIG. 9 shows a portion of a bottom end of a plenum according to embodiments of the disclosed subject matter.

FIG. 9 shows a portion of a bottom end of the plenum 432. As discussed above, the bottom end of the plenum 432 may correspond to the first end of the plenum 432, and may be fixedly coupled to a mounting base, such as mounting base 250 discussed above. The bottom end of the plenum 432 may have a floor 236. The floor 236 can have one or more drains 237, i.e., openings, provided therein. In that the second end of the plenum 432 may be open, rainfall may enter the inner volume of the plenum 432. In this regard, the one or more drains 237 (FIG. 9 shows 5 drains) may allow rainwater to exit the inner volume of the plenum 432. The openings corresponding to the drains 237 may be sized so as to allow water to pass, but to disallow entry of an operator's foot, for instance. The floor 236 may have an anti-skid configuration to prevent or minimize slipping in the case of an operator entering the inner volume of the plenum 432 via service door 231.

Figure 10:
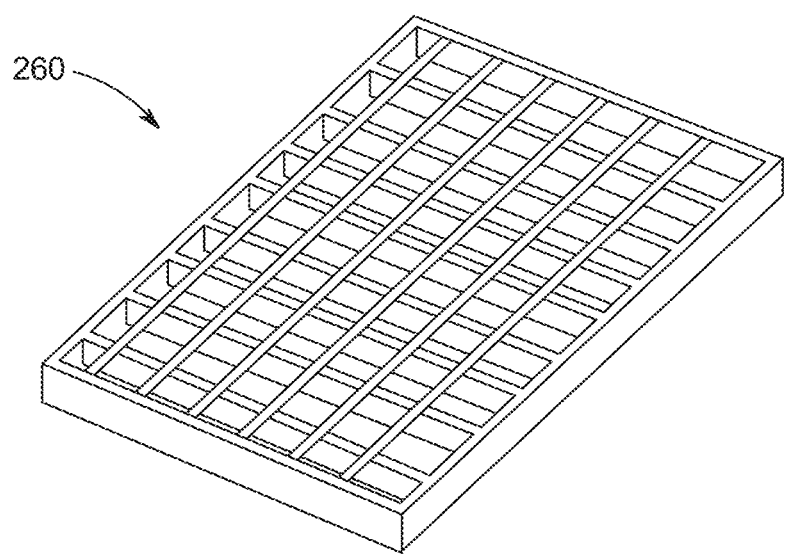
FIG. 10 is a perspective view of a top cover of or for plenums according to embodiments of the disclosed subject matter.
Figure 11:
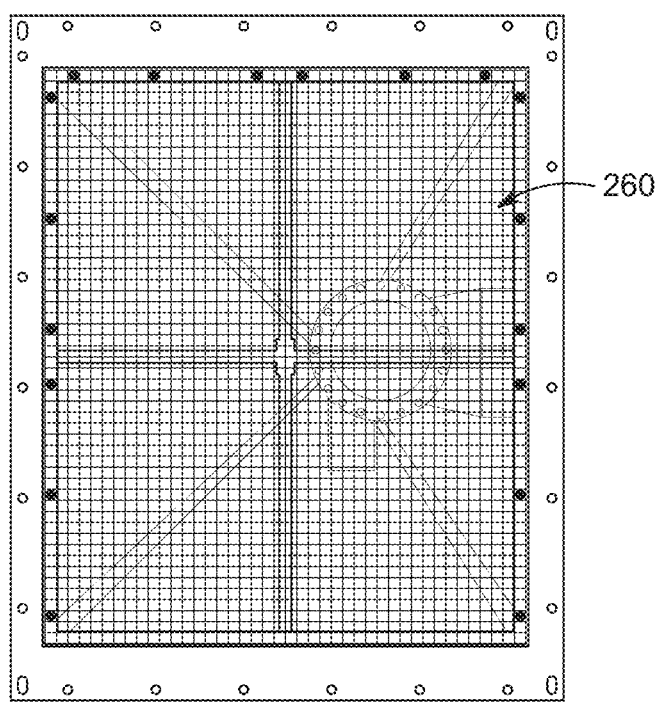
FIG. 11 is a top end view of a plenum according to embodiments of the disclosed subject matter.

FIG. 10 is a perspective view of a top cover 260 of or for plenums according to embodiments of the disclosed subject matter. The top cover 260 can be removably coupled (e.g., via bolts) to the frame 240 of the plenum 232, at the second end of the plenum 232. The top cover 260 may be porous, for instance, in the form of a grate or screen, which may be to prevent unwanted objects, such as birds, from entering the inner volume of the plenum 232, while at the same time allowing some. The top cover 260 may be made of a galvanized material, and may be load bearing. As shown in FIG. 11, for instance, the top cover 260 may be a two by two square configuration, with crossing support beams or frames.

Figure 12:
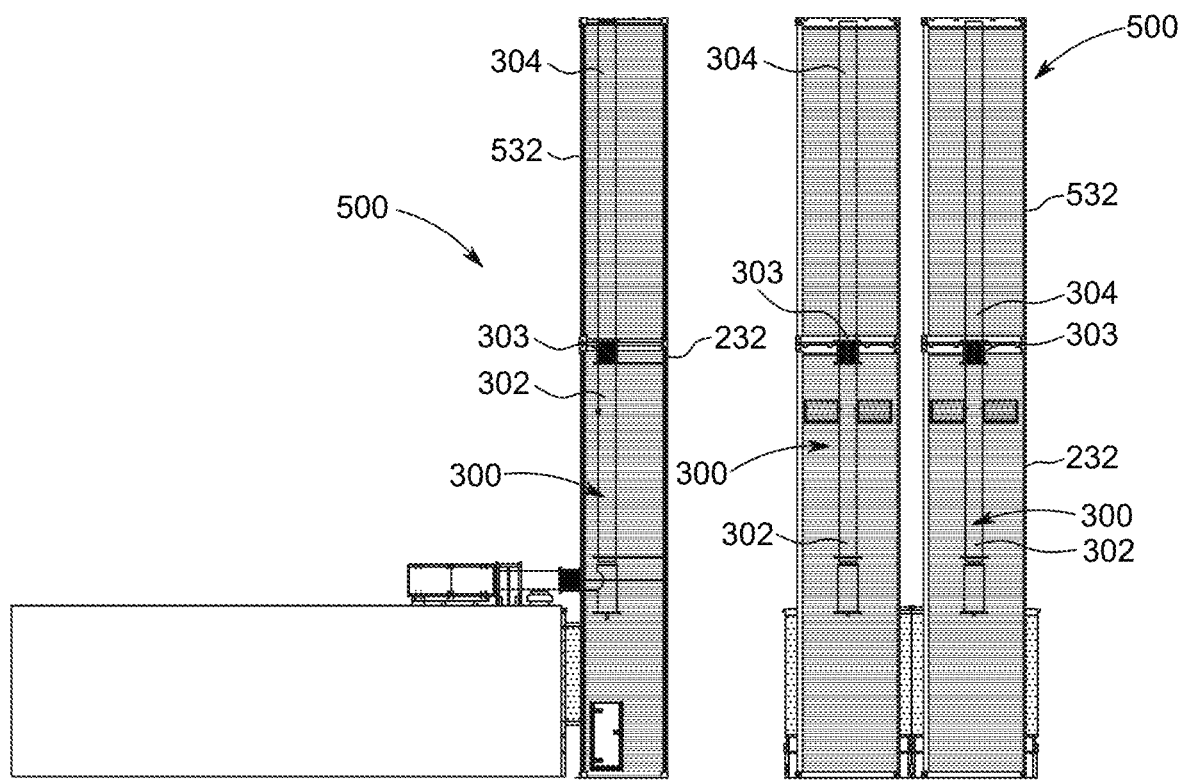
FIG. 12 shows side and end views of a system according to embodiments of the disclosed subject matter.
Figure 13:
FIG. 13 shows an overhead view of the system of FIG. 11.

FIG. 12 shows side and end views of a system 500 according to embodiments of the disclosed subject matter, and FIG. 13 shows an overhead plan view of the system 500. The system 500 is similar to the system 200 discussed above.

Notably, different from system 200, the plenum system 530 of system 500 includes the plenum 232, which may be referred to as first plenum 232, and another plenum, plenum 532, which may be referred to as second plenum 532. As shown, the second plenum 532 may be vertically stacked on the first plenum 232 such that the second end of the first plenum 232 is fixedly coupled to the first end of the second plenum 532. The second end of the second plenum 532 can be open (which can include having a top cover, such top cover 260). The second plenum 532 can be similar to the first plenum 232, and can be in the form of a hollow elongate rectangular box, for instance. The first plenum 232 and the same plenum 532 may be of the same length, or, alternatively, the first plenum 232 may be longer than the second plenum 532, such as shown in FIG. 12. As but one example, the first plenum 232 may be forty feet in length, and the second plenum 532 may be thirty feet in length. Another combination not expressly shown can be two stacked forty-feet plenums 232.

FIG. 12 also expressly shows the exhaust conduit 300. As a non-limiting example, exhaust conduit 300 may be a circular pipe with a twenty inch diameter. As shown, the exhaust conduit 300 can extend vertically in the plenum 232. Thus, the depiction and description of the exhaust conduit 300 in FIG. 12 can be applicable to the exhaust conduit of the system 200 discussed earlier.

Without the second plenum 532, the exhaust conduit 300 can extend to or just below a height of the second end of the plenum 232. For the system 500, however, the exhaust conduit 300 may include distinct exhaust conduit portions, a first exhaust conduit portion 302 associated with the first plenum 232 and a second exhaust conduit portion 304 associated with the second plenum 532. As shown, the exhaust conduit 300, particularly the second exhaust conduit portion 304, can extend to or just below a height of the second end of the plenum 532. In any event, the exhaust conduit 300 may be entirely inside the plenum 232 or the combination of the plenum 232 and plenum 532.

The first exhaust conduit portion 302 may be communicatively coupled to the second exhaust conduit portion 304 by way of a connection interface 303. The connection interface 303 may be a flexible bellow, for instance, a rotatable flexible flange bellow. A flexible bellow, such as a rotatable flexible flange bellow may accommodate for variations in the positioning between adjacent ends of the first exhaust conduit portion 302 and the second exhaust conduit portion 304.

Figure 14:
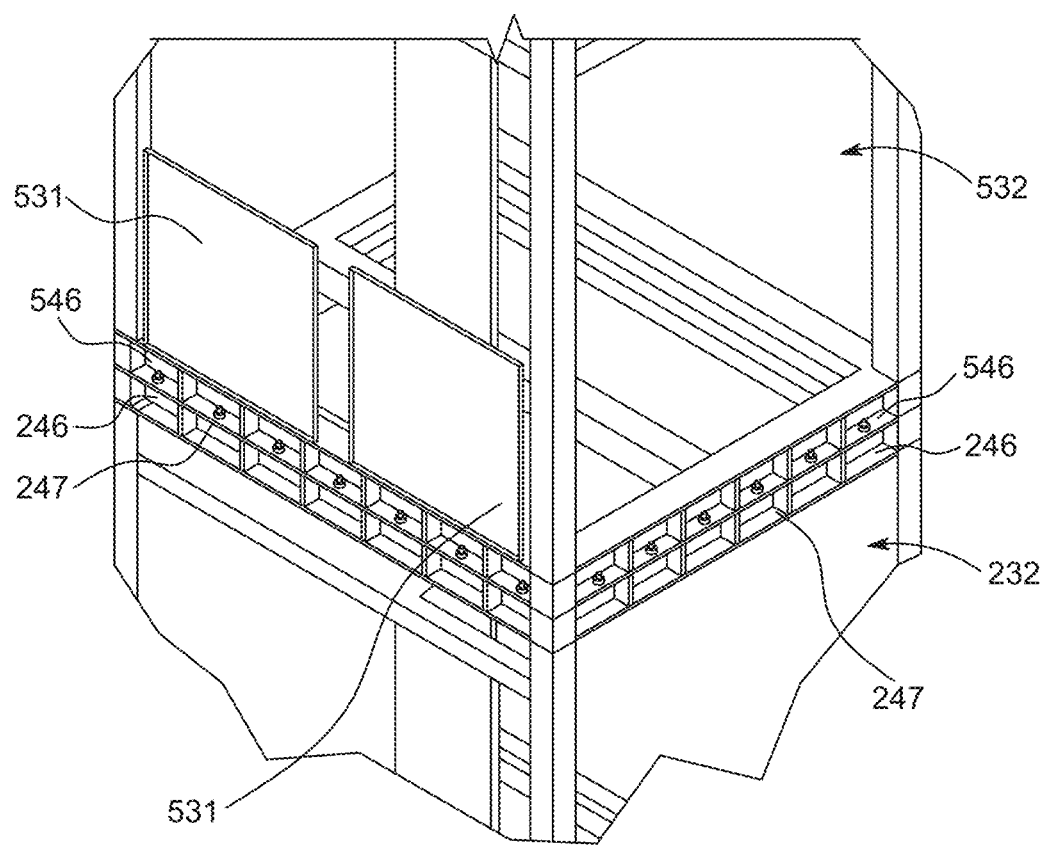
FIG. 14 shows a perspective view of an interface of two vertically stacked plenums according to embodiments of the disclosed subject matter.

Turning to FIG. 14, this figure shows a perspective view of a connection interface between two vertically stacked plenums, such as plenum 232 and plenum 532. The fixed connection between the plenum 232 and the plenum 532 can be similar to the fixed connection between the plenum 232 and the mounting base 250. That is, fastening interfaces 246 at the second end of the first plenum 232 can be fixedly coupled to a corresponding fastening interfaces 546 of the second plenum 532 using fasteners 247.

The fastening interfaces 246 of the first plenum 232, and likewise the fastening interfaces 546 of the second plenum 532, may be externally accessible, i.e., accessible from outside the plenum stack, and optionally not from inside the plenum stack. Thus, to fixedly couple the second plenum 532 to the first plenum 232 it may not be necessary to access the inner volume of the plenum stacks. As an example, the fastening interfaces 246 of the first plenum 232, and likewise the fastening interfaces 546 of the second plenum 532, may be in the form of H-beams.

FIG. 14 also shows that the second plenum 532 can include one or more service or access doors 531. Each of the access doors 531 may allow access to inside the plenum stack. The access doors 531 may be latched and/or may include a retention apparatus (e.g., a chain) to prevent the access doors 531 from being completely separated from the plenum stack.

Figure 15:
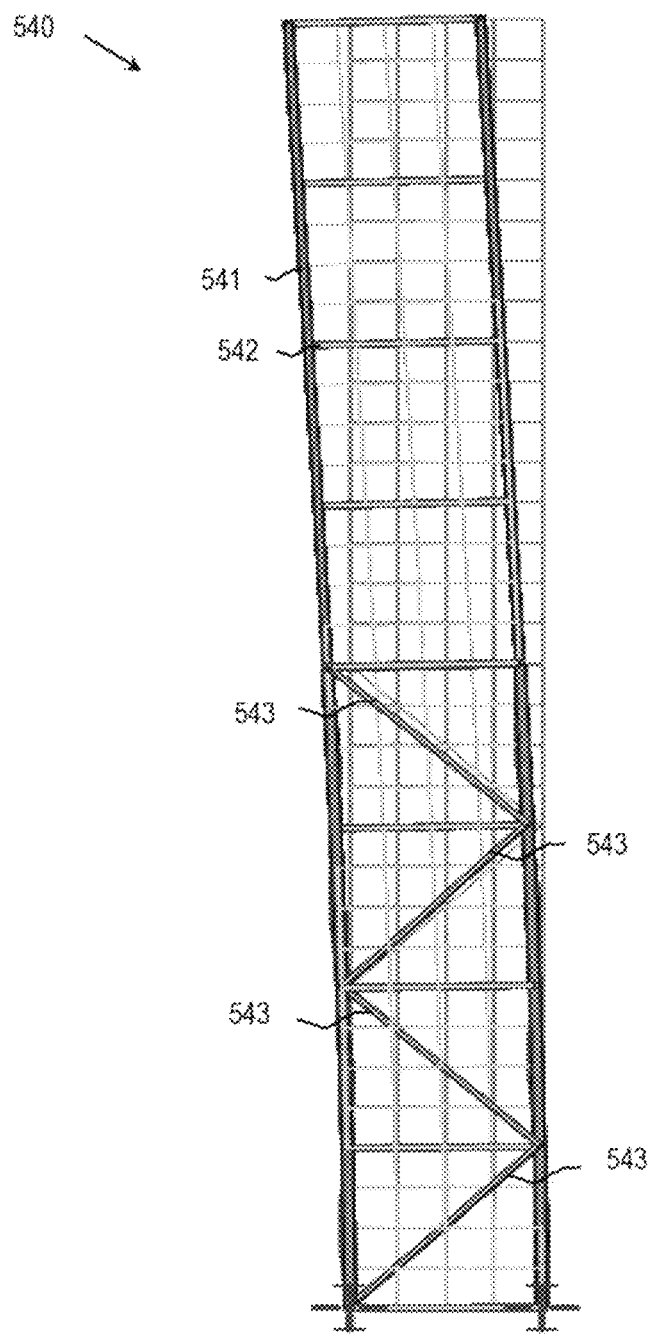
FIG. 15 shows a schematic view of a frame of a plenum according to embodiments of the disclosed subject matter.

FIG. 15 shows a schematic view of a frame 540 of a plenum stack (exaggerated sway to show resiliency to external forces, such as forces due to wind), such as the plenum stack of the first plenum 232 and the second plenum 532 discussed above. Here, the frame 540 includes a plurality of diagonal support structures (e.g., reinforcing beams) 543, in addition to vertical support beams 541 and horizontal support beams 542. The diagonal support structures 543 may extend diagonally between junctures of corresponding vertical support beams 541 and horizontal support beams 542. The diagonal support structures 543 may be inward of an inner surface of the sidewalls 233 of the plenum stack, and may be provided on one, some, or all faces per unit cube or block segment along the length of the plenum stack. Optionally, such as shown in FIG. 15, the diagonal support structures 543 may be provided only on a portion of the plenum stack. For instance, FIG. 15 shows diagonal support structures 543 associated with only the first plenum 232. As a more specific example, diagonal support structures may be provided only for the first forty feet of the plenum stack. Hence, as shown in exaggerated form in FIG. 15, the portion of the plenum stack without the diagonal support structures 543 may sway or bend relatively more than the portion of the plenum stack with the diagonal support structures 543.

Figure 16:
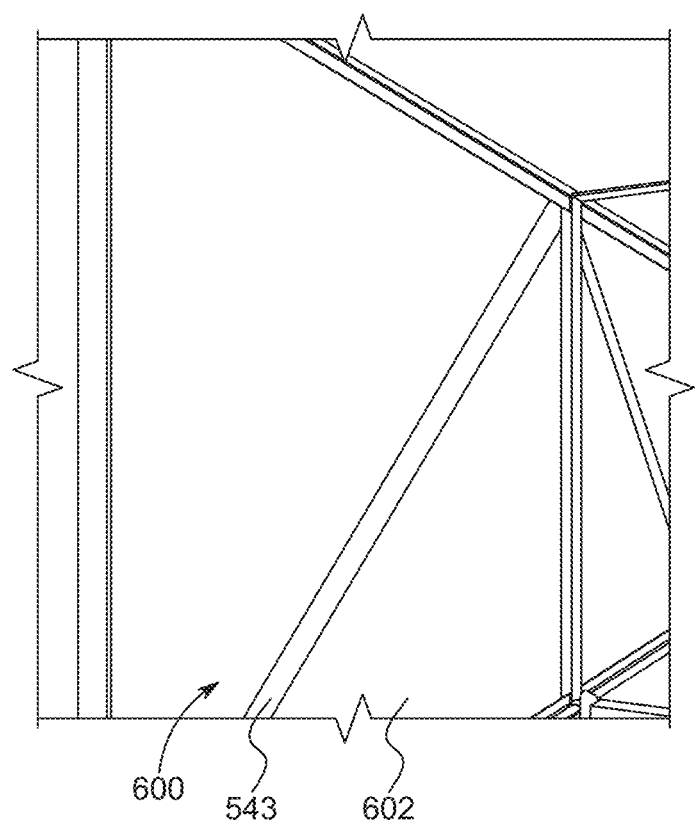
FIG. 16 is an image of a portion of an inner wall of a plenum according to embodiments of the disclosed subject matter.

FIG. 16 is an image of a portion of an inner wall of a plenum according to embodiments of the disclosed subject matter. Notably, FIG. 16 shows diagonal support structures 543 and a sound attenuation assembly 600, which can be provided on inner surfaces of the sidewalls 233 of the plenum. The sound attenuation assembly 600 may have a hydrophobic sound absorption layer 602. For instance, the hydrophobicity may be greater than 98.8% and/or the sound absorption coefficient can be 4000 Hz/0.87-1.08, the latter of which depending upon the thickness (e.g., 4 in., 70 mm-50 mm, etc.). As a non-limiting example, the hydrophobic sound absorption layer 602 can be comprised of fiberglass wool. The sound attenuation assembly 600 may also include perforated aluminum sheets covering the hydrophobic sound absorption layer 602.

Figure 17A:
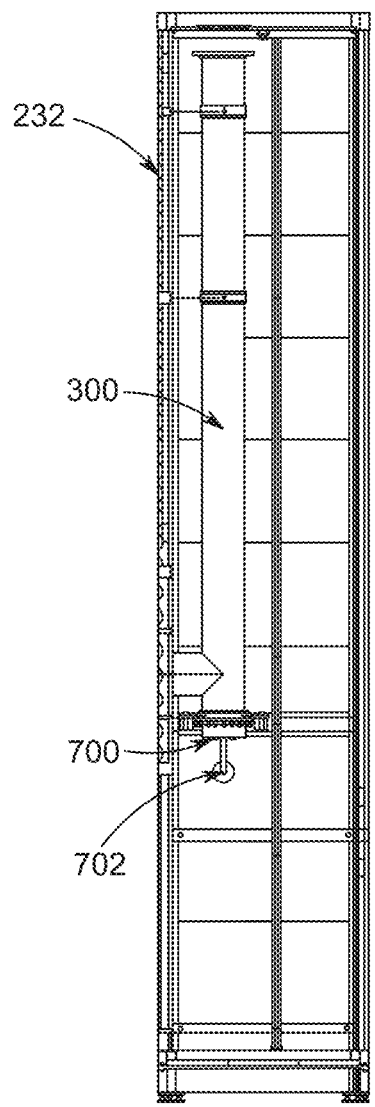
FIG. 17A and FIG. 17B are schematics of a condensate drainage system according to embodiments of the disclosed subject matter.
Figure 17B:
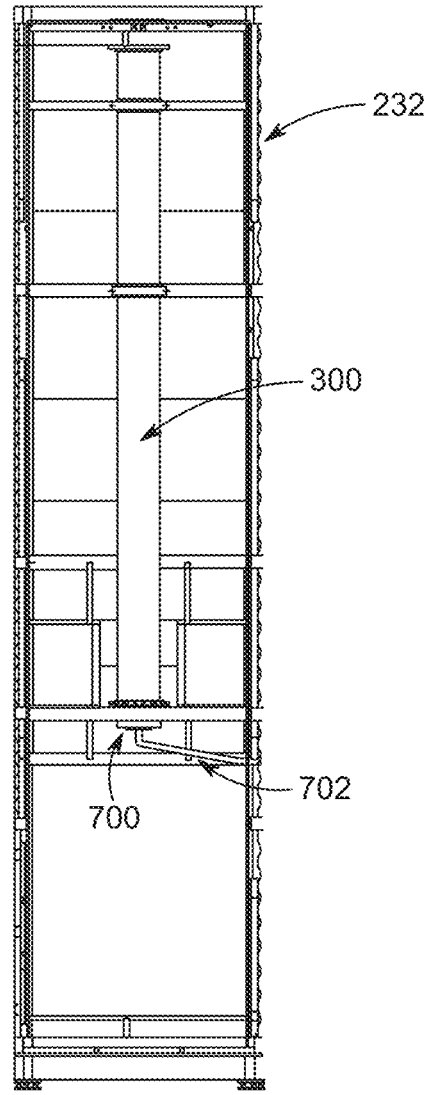

FIG. 17A and FIG. 17B are schematics of a condensate drainage system 700 according to embodiments of the disclosed subject matter. Generally, when rainwater enters the exhaust conduit 300 at the same time that the exhaust conduit 300 is passing exhaust gas from the generator, condensate may form at the bottom of the exhaust conduit 300. As shown in FIG. 17A, the exhaust conduit 300 may be in the form of a T-joint, to allow the exhaust gas to pass upward but to allow rainwater to fall below the exhaust gas entryway and to the drainage system 700. The condensate drainage system 700 can capture die condensate at a reservoir portion below the flow path of the exhaust gas and output the condensate (including rainwater) to outside the plenum 232 via piping 702. The piping 702 may be sized to create a suitable pressure different so the exhaust gas travels upward in the exhaust conduit 300, rather than downward to the condensate drainage system 700.

INDUSTRIAL APPLICABILITY

As noted above, the present disclosure relates to plenums adapted to process and output one or more byproducts from a generator of a generator set. Plenum systems according to embodiments of the disclosed subject matter can be modular in nature, meaning that they can be provided according to varying heights, either as a single plenum or as a stack of two or more plenums. Plenum systems can have provisions that facilitate transport and installation, along with operational features that can efficiently and effectively output one or more byproducts caused by operation of an electric generator in a directed manner to a specific location. Plenum systems according to embodiments of the disclosed subject matter may also be adapted to withstand a variety of environmental conditions, such as rain, high wind loads (e.g., ISO container derivative able to withstand 90, 120, and 150 mph wind ratings), sunlight bird strike, seismic activity (e.g., up to seismic category D), etc., for instance, without additional support structures (e.g., without a guide wire).

Generally, plenum systems according to embodiments of the disclosed subject matter can pertain to a plenum chamber, which can be a pressure neutralizing chamber, that carries heat and optionally exhaust gases through a mechanical duct or plenum high above the living atmosphere and release the heat and optionally exhaust gases. The configuration of the system can also discharge of exhaust condensate while raining and avoid corrosion. Plenum systems according to embodiments of the disclosed subject matter can also be capable of achieving suitable sound attenuation requirements.

As noted above with respect to FIG. 1, exhaust gas from the generator may also be output from the plenum 130. The plenum 130, according to one or more embodiments, can output the heated air and optionally exhaust gas vertically such that the heated air and optionally exhaust gas exit the plenum primarily in a vertical direction.

Thus, the plenum 130 can output heated air and optionally exhaust gas from a corresponding generator to the atmosphere at an acceptable height. As shown in FIG. 1, the heated air H can be outputted to the atmosphere at a height above the data center buildings 110. Thus, as diagrammatically shown in FIG. 1, this provision may allow for cooling air C for the data center buildings 110 to be unaffected by the heated air H exhausted from the generator set. Additionally or alternatively, acceptable height, as used herein, can mean a height set by local, region, or national regulatory requirements. Generally, at least in the case of outputting exhaust gas from the generator, such acceptable height can be above at least a so-called next level of atmosphere or living atmosphere at a ground level, for instance. Acceptable height may also mean a height above a multi-story structure, such as a multi-story data center. As discussed above, the plenum 130 may be a single plenum or a plenum stack of two or more plenums.

Embodiments of the disclosed subject matter can thus not create unsatisfactory back pressure on the generator set package: can withstand wind loads, rains, bird entries and other natural calamities; can be modular in design that can suit various customers as norms changes based on the installation site; can be installation friendly and transportation friendly; can drain condensate; and/or can meet sound attenuation norms or requirements.

Installation can involve, with the generator set already installed, positioning the plenum 232, 332, 432 (or some other length) on the mounting surface 205. The exhaust conduit 300 can be installed, and the plenum 232, 332, 432 may then be connected to the generator set. In particular, the first opening 234 and the second opening 235 may be positioned relative to the generator set and connected to the heat interface 224 and the exhaust interface 225, respectively. The connection process may involve adjustment of the plenum height using the mounting base 250. For instance, one or more of the corner heights can be adjusted using respective mounting feel 252 and adjustment screws 253. Optionally, an additional plenum (e.g., plenum 532 or some other length) may be stacked on the initial plenum 232, 332, 432. And yet another plenum may be stacked on the second plenum, depending upon the overall height needed for the plenum stack.

Once fully assembled, when the generator of the generator set is operating, the plenum 232, 332, 432 can pass heated air from the first opening 234 to the second, open end of the plenum 232, 332, 432. If the plenum 232, 332, 432 is the only plenum, the heated air may be output from the second end of the plenum 232, 332, 432 to the atmosphere (including through top cover 260). If the plenum 232, 332, 432 is not the only plenum, the heated air may be passed to the additional plenums (e.g., plenum 532) and ultimately to the atmosphere. At the same time, exhaust gas can pass from the second opening 235 to and through the exhaust conduit 300 to the atmosphere. As noted above and shown in the figures, the outlet of the exhaust conduit 300 can be at or just below the height of the plenum 232, 332, 432, or the height of the overall plenum stack. The processing of the heated air can be such that back pressure above a predetermined threshold is not created or prevented. Any condensate formed inside the exhaust conduit 300 may be drained via a conduit drainage system 700 at a bottom portion of the exhaust conduit 300.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

The invention claimed is:

1. A modular system for venting one or more generators of a generator set of a data center, the modular system comprising:

a mounting base adapted to be mounted on a mounting surface;

a first vertical plenum in the form of a first hollow elongate rectangular box having a depth, a width and a length, the length being greater than the width and the depth, where the first hollow elongate rectangular box also has a first end and a second end opposite the first end, and where the first end is fixedly coupled to the mounting base and the second end is open; and an exhaust conduit that extends vertically inside the first vertical plenum toward the second end of the first vertical plenum, wherein the first vertical plenum is adapted to be open to atmosphere, wherein the first vertical plenum has a first opening in a sidewall on a first side of the first vertical plenum and is adapted to receive heated air associated with operation of one of the one or more generators via the first opening and pass the heated air to the second end of the first vertical plenum, wherein the first vertical plenum has a second opening in the sidewall on the first side of the first vertical plenum and receives an inlet of the exhaust conduit such that the exhaust conduit is adapted to receive exhaust gas from said one of the one or more generators, wherein the second end of the first vertical plenum extends to a predetermined height such that the heated air and the exhaust gas are output from the first vertical plenum at a level of atmosphere higher than a predetermined level of atmosphere of the data center, and wherein the first opening and the second opening are non-overlapping in a length direction of the first hollow elongate rectangular box.

2. The modular system according to claim 1, wherein the first vertical plenum is adapted to output the heated air and the exhaust gas to the atmosphere.

3. The modular system according to claim 1, wherein the first vertical plenum has a frame, wherein sidewalls of the first vertical plenum, including the sidewall having the first and second openings, are corrugated and fixed to the frame, and wherein the frame includes lifting castings at all corners thereof.

4. The modular system according to claim 3, wherein the frame includes lifting castings between the lifting castings at the corners of the first end of the first vertical plenum and the lifting castings at the corners of the second end of the first vertical plenum.

5. The modular system according to claim 1, wherein the first vertical plenum has a frame, the frame having respective sets of vertical and horizontal support beams at the first end and the second end of the first vertical plenum, and a set of vertical and horizontal support beams at least one location between the first end and the second end of the first vertical plenum.

6. The modular system according to claim 5, wherein the frame has a plurality of diagonal support beams extending from each of the sets of vertical and horizontal support beams at the first and second ends and at the at least one location between the first end and the second end of the first vertical plenum.

7. The modular system according to claim 1, wherein all corners of the mounting base are individually adjustable in height.

8. The modular system according to claim 1, wherein the first vertical plenum is adapted to prevent back pressure for the heated air such that the heated air is prevented from being supplied, via the first opening, back to said one of the one or more generators.

9. The modular system according to claim 1, wherein the first vertical plenum has a first set of H-beam fastening interfaces around a perimeter thereof at the first end, and a second set of H-beam fastening interfaces around the perimeter thereof at the second end.

10. The modular system according to claim 9, further comprising a second vertical plenum in the form of a second hollow elongate rectangular box vertically stacked on the first vertical plenum such that a first end of the second vertical plenum is fixedly coupled to the second end of the first vertical plenum and a second end of the second vertical plenum opposite the first end is open,
   wherein the second vertical plenum has a third set of H-beam fastening interfaces around a perimeter thereof at the first end and a fourth set of H-beam fastening interfaces around the perimeter thereof at the second end, and
   wherein the second vertical plenum is fixedly coupled to the first vertical plenum via fasteners that respectively fasten the third set of H-beam fastening interfaces of the second vertical plenum to the second set of H-beam fastening interfaces of the first vertical plenum.

11. The modular system according to claim 10,
   wherein the exhaust conduit extends vertically inside the second vertical plenum toward the second end of the second vertical plenum, and
   wherein the second vertical plenum is adapted to output the heated air and the exhaust gas to the atmosphere.

12. The modular system according to claim 1,
   wherein sidewalls of the first vertical plenum, including the sidewall having the first and second openings, are corrugated, and
   wherein each of the corrugations runs perpendicular to the length of the first hollow elongate rectangular box.

13. The modular system according to claim 1, wherein the exhaust conduit is closer to said sidewall on the first side of the first vertical plenum than to a sidewall opposite said sidewall.

14. The modular system according to claim 1, wherein a top of the exhaust conduit is below the second end of the first vertical plenum.

15. The modular system according to claim 1, wherein the mounting base is removably mounted to the mounting surface, and the first vertical plenum is removably fixedly coupled to the mounting base.

16. The modular system according to claim 1, further comprising a rectangular service door provided in another sidewall on a second side of the first vertical plenum different from said sidewall that includes the first and second openings on the first side of the first vertical plenum,
   wherein the rectangular service door has a length greater than a width, the length running in the length direction of the first hollow elongate rectangular box, and
   wherein the rectangular service door is adjacent to the first end of the first hollow elongate rectangular box.

17. A method regarding a modular system for processing byproducts of a generator of a genset that extends in a horizontal direction, the method comprising:
   providing a first vertical plenum in the form of a first hollow elongate rectangular box having a first end and a second end opposite the first end, the first end being adapted to be fixedly coupled to a mounting surface;
   providing a second vertical plenum in the form of a second hollow elongate rectangular box, the second vertical plenum being stacked on the first vertical plenum in end-to-end fashion on the second end of the first hollow elongate rectangular box such that the first and second hollow elongate rectangular boxes are aligned with each other along a common longitudinal axis thereof; and
   providing an exhaust conduit that extends inside the first vertical plenum and the second vertical plenum,
   wherein the second vertical plenum is adapted to be open to atmosphere,
   wherein the first vertical plenum has a first opening in a sidewall and is adapted to receive heated air associated with operation of the generator via the first opening and pass the heated air to the second end of the first vertical plenum,
   wherein the first vertical plenum has a second opening in the sidewall and receives an inlet of the exhaust conduit such that the exhaust conduit is adapted to receive exhaust gas from the generator, and
   wherein each of the second end of the first vertical plenum and an outlet of the exhaust conduit is at a predetermined height above the first and second openings.

18. The method according to claim 17, further comprising passing the heated air from the first opening in the sidewall of the first vertical plenum to the second end of the first vertical plenum and simultaneously passing the exhaust gas from the second opening in the sidewall to the second end of the first vertical plenum by way of the exhaust conduit without creating back pressure above a predetermined threshold for the heated air.

19. The method according to claim 17, further comprising fixedly coupling the second vertical plenum in the form of the second hollow elongate rectangular box on the second end of the first vertical plenum such that the first and second vertical plenums are aligned along the common longitudinal axis,
   wherein the second vertical plenum in the form of the second hollow elongate rectangular box has a second length less than a first length of the first vertical plenum in the form of the first hollow elongate rectangular box,
   wherein the first vertical plenum and the second vertical plenum are fixedly coupled to each other via opposing sets of fasteners and externally accessible fastening interfaces,
   wherein in an overhead plan view the first and second hollow elongate rectangular box do not overlap the genset extending in the horizontal direction, and
   wherein the second opening is closer to the second end of the first hollow elongate rectangular box than the first opening is to the second end of the first hollow elongate rectangular box.

20. The method according to claim 17, further comprising, when the exhaust conduit is receiving and outputting exhaust gas, draining condensate from inside the exhaust conduit to outside the first vertical plenum using a condensate drainage system operatively provided at a bottom portion of the exhaust conduit.

21. A plenum system including a hollow elongate rectangular box having a length greater than a width and a depth, the hollow elongate rectangular box also having a first end and a second end opposite the first end for processing one or more byproduct outputs from a generator of a generator set of one or more generators, where the second end of the hollow elongate rectangular box outputs the one or more byproducts, the plenum system comprising:
   a frame, all corners of the frame having lifting castings;
   a corrugated sidewall fixed to the frame; and an exhaust conduit inside an internal volume of the hollow elongate rectangular box, wherein the frame has respective sets of vertical and horizontal support beams at the first end of the hollow elongate rectangular box and the second end of the hollow elongate rectangular box, and a set of vertical and horizontal support beams at a plurality of locations spaced apart from each other in a length direction of the hollow elongate rectangular box, between the first end and the second end of the hollow elongate rectangular box, wherein the hollow elongate rectangular box is adapted to be oriented vertically when operatively coupled to receive the one or more byproduct outputs from the generator, wherein the corrugated sidewall includes a first opening adapted to receive heated air from the generator as one of the one or more byproduct outputs from the generator, wherein the corrugated sidewall includes a second opening, the second opening receiving an inlet of the exhaust conduit such that the exhaust conduit is adapted to receive exhaust gas from the generator as another of the one or more byproduct output from the generator, and wherein the second opening is offset from the first opening, and the second opening is closer to the second end of the hollow elongate rectangular box than the first opening is to the second end of the hollow elongate rectangular box.

22. The plenum system according to claim 21, wherein the frame has a plurality of diagonal support beams extending from each of the sets of vertical and horizontal support beams.

23. The plenum system according to claim 21, further comprising a sound attenuation assembly covering inner surfaces of the corrugated sidewall, the sound attenuation assembly including a hydrophobic sound absorption layer made of fiberglass wool.

24. The plenum system according to claim 21,
wherein the first end of the hollow elongate rectangular box includes a first set of H-beam fastening interfaces, and the second end of the hollow elongate rectangular box includes a second set of H-beam fastening interfaces, and wherein the first and second sets of H-beam fastening interfaces are accessible for fastening only from outside the hollow elongate rectangular box.

25. A plenum system including a first hollow elongate rectangular box having a first length greater than a first width and a first depth, the first hollow elongate rectangular box also having a first end and a second end opposite the first end for processing one or more byproduct outputs from a generator of a generator set, and a second hollow elongate rectangular box having a second length greater than a second width and a second depth, the second elongate rectangular box also having a third end and a fourth end opposite the third end, where third end of the second hollow elongate box is coupled to the second end of the first hollow elongate rectangular box, and the fourth end of the second hollow elongate rectangular box outputs the one or more byproducts after having passed through the first and second hollow elongate rectangular boxes, the plenum system comprising:

a frame;

a sidewall fixed to the frame; and an exhaust conduit entirely inside an internal volume of the first and second hollow elongate rectangular boxes, wherein the frame has respective sets of vertical and horizontal support beams for each of the first hollow elongate rectangular box and the second hollow elongate rectangular box, wherein the first and second hollow elongate rectangular boxes are adapted to be oriented vertically and coaxial when operatively coupled to receive the one or more byproduct outputs from the generator, wherein the sidewall includes a first opening to receive heated air from the generator as one of the one or more byproduct outputs from the generator, wherein the sidewall includes a second opening to receive an inlet of the exhaust conduit such that the exhaust conduit is adapted to receive exhaust gas from the generator as another of the one or more byproduct output from the generator, wherein a portion of the exhaust conduit runs parallel to a length direction of the first and second hollow elongate rectangular boxes, and wherein the portion of the exhaust conduit that runs parallel to the length direction is closer to said sidewall that includes the first opening and the second opening than to any other sidewalls of the first hollow elongate rectangular box.

* * * * *